United States Patent [19]
Chen et al.

[11] Patent Number: 5,807,773
[45] Date of Patent: Sep. 15, 1998

[54] SELF-ALIGNED GATE FABRICATION PROCESS FOR SILICON CARBIDE STATIC INDUCTION TRANSISTORS

[75] Inventors: Li-Shu Chen, Ellicott City, Md.; Rowland C. Clarke, Saltsburg; Richard R. Siergiej, Harrison City, both of Pa.

[73] Assignee: Northrop Grumman Corporation, Los Angeles, Calif.

[21] Appl. No.: 688,587

[22] Filed: Jul. 30, 1996

[51] Int. Cl.⁶ .................................................. H01L 21/337
[52] U.S. Cl. ............................................ 438/192; 438/931
[58] Field of Search .......................... 437/40 JF, 40 SW, 437/41 JF, 41 SW, 100, 911; 257/77, 264; 438/192, 931

[56] References Cited

U.S. PATENT DOCUMENTS

| | | | |
|---|---|---|---|
| 5,260,227 | 11/1993 | Farb | 437/41 |
| 5,612,547 | 3/1997 | Clarke | 257/77 |

FOREIGN PATENT DOCUMENTS 0594248  4/1994  European Pat. Off. .

OTHER PUBLICATIONS

Clarke, R.C. et al., 30W VHF 6H–SIC Power Static Induction Transistor, Proceedings of the IEEE/Cornell Conference on Advanced Concepts in High Speed Semiconductor Devices and Circuits, Ithaca, New York, Aug. 7–9, 1995, 7 Aug. 1995, Institute Of Electrical and Electronics Engineers, pp. 47–55, XP000626601, see p. 49, figures 3–6.

*Primary Examiner*—John Niebling
*Assistant Examiner*—Michael S. Lebentritt
*Attorney, Agent, or Firm*—Walter G. Sutcliff

[57] ABSTRACT

A method of aligning a gate and a source of a silicon carbide static induction transistor comprising the steps of depositing an oxide layer over the transistor, forming oxide spacers from the oxide layer where the oxide spacers are adjacent the source, depositing a metal layer over the transistor and removing the oxide spacers so that the resulting gates are accurately aligned with the source.

36 Claims, 6 Drawing Sheets

SELF-ALIGNED GATE FABRICATION PROCESS FOR SILICON CARBIDE STATIC INDUCTION TRANSISTORS

BACKGROUND OF THE INVENTION

The present invention relates to a silicon carbide (SiC) static induction transistors (SITs) and a method of fabricating SiC SITs. More specifically, the invention relates to a SiC SIT having a self-aligned gate and a method of aligning the gate with the source.

DESCRIPTION OF THE RELATED ART

Figure 4:
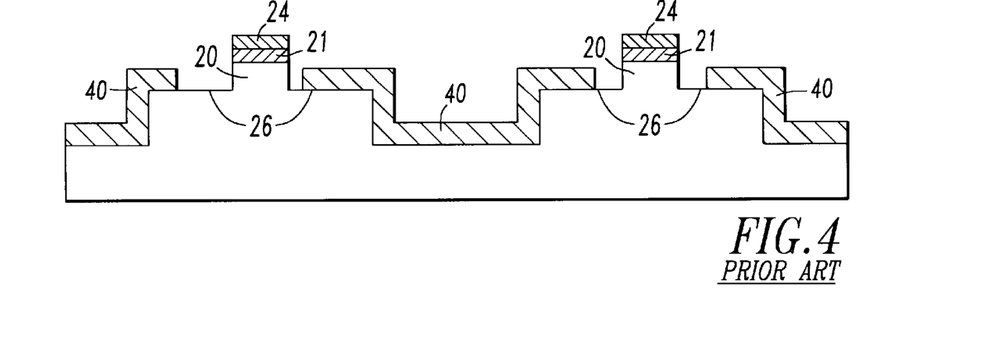

SiC SITs and methods of manufacturing SiC SITs are well known. As shown in FIG. 4, known SiC SITs include one or more source posts 20, a source 21 on the surface of each source post 20, a source contact 24 covering each source 21, and one or more pairs of gates 40 aligned relative to the source 21. The alignment of the gates 40 relative to the source 21 is critical to the performance of the SiC SIT. Misalignment can adversely affect performance by causing voltage gain problems, current shortages between the source 21 and the gates 40, and inconsistent voltages between the source 21 and the gates 40.

While it is possible to fabricate SiC SITs having gates accurately aligned with the sources, known methods of fabrication cannot consistently and accurately align a gate with the source. Known methods rely on trial and error to accurately align the source and the gate.

Figure 1:
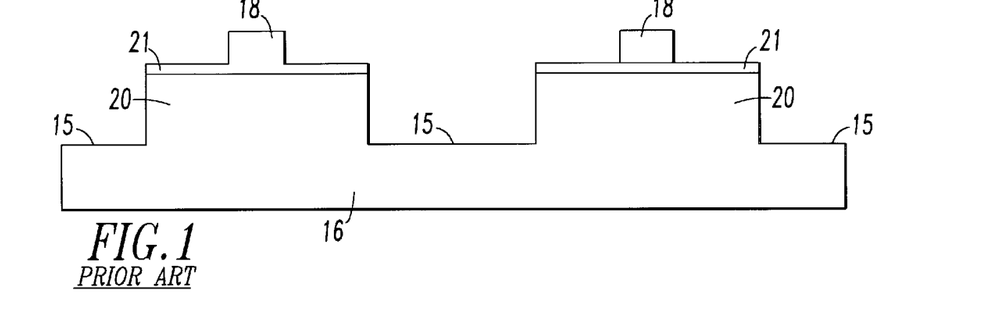
FIGS. 1 to 4 illustrate various steps in the manufacture of a silicon carbide static induction transistor in accordance with the known prior art.
Figure 2:
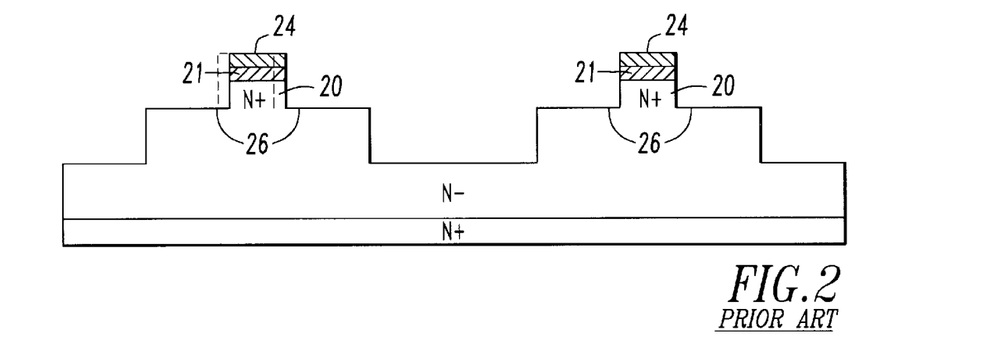
Figure 3:
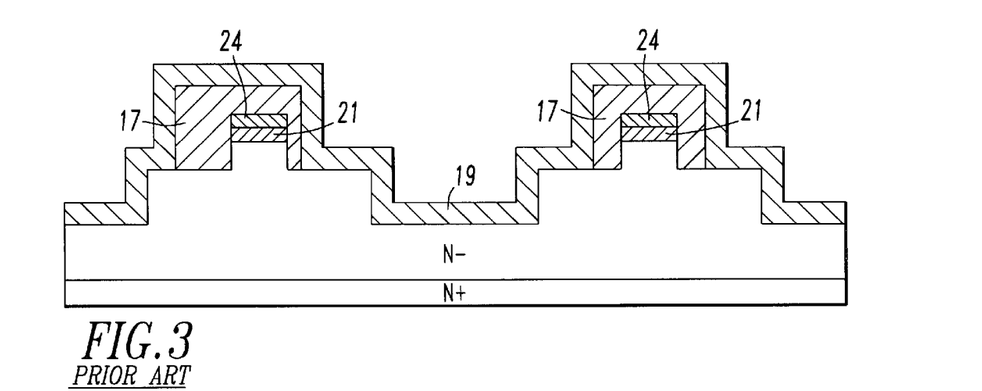

One known method of producing SiC SITs is shown in FIGS. 1–4. Referring to FIG. 1, a SiC substrate 16 is shown having trenches 15 etched into the substrate 16 using known masking and/or etching techniques. The sources 21 are masked with a resist 18 and etched to form source posts 20 having the source 21 at its surface and source shoulders 26, as shown in FIG. 2. Source contacts 24 are also formed over the sources 21. Thereafter, the source contacts 24, the source posts 20 and portions of the source shoulders 26 are masked with a resist 17 a second time, followed by a complex metal layer 19 deposition as shown in FIG. 3. When the resist 17 is removed, gates 40 are left behind as shown in FIG. 4. Ideally, the gates 40 are aligned with the source posts 20 so that the gates 40 are an equal distance from the source posts 21 and thus an equal distance form the sources 21. In other words, it is desirable for each source 21 to be centered relative to a pair of gates 40. It is also desirable that the gates 40 cover at least a portion of the source shoulders 26.

However, due to inaccuracies inherent in the masking and etching steps, it is common for the gates 40 to be misaligned with the source posts 20 such that the gates 40 are not equidistant from the source posts 20 and thus the gates are not equidistant from the sources 21 (e.g. the source is not centered relative to the gates). The inaccuracies may be caused during the masking and etching steps forming the source shoulders 26. The masking and etching step is not consistently accurate and the source post 20 may be skewed off center such that the shoulders 26 surrounding the source post 20 may be unequal in length, as shown in FIG. 2. Because the source post 20 is skewed from the center, gates 40 that are subsequently formed may not be equidistant from the source posts 20 or the sources 21.

The inaccuracy may also be caused during the masking for forming the gates 40. The masking is not consistently accurate and the gates 40 may be misaligned so as not to be equidistant from the source posts 20 or the sources 21 as shown in FIGS. 3 and 4.

There is a need for a method of producing SiC SITs where a gate can be consistently and accurately aligned with the source post and thus the source.

Thus, it is an object of this invention to provide a method of producing SiC SITs where the gate is consistently aligned with the source post and the source.

It is another object of this invention to provide a method of producing SiC SITs where the gate is aligned with the source post and the source to between about 0.02 and 0.1 micrometers of a desired alignment.

It is yet another object of the invention to provide a method of producing SiC SITs where the gate formation compensates for inaccuracies in the masking and etching steps.

DETAILED DESCRIPTION

Figure 5:
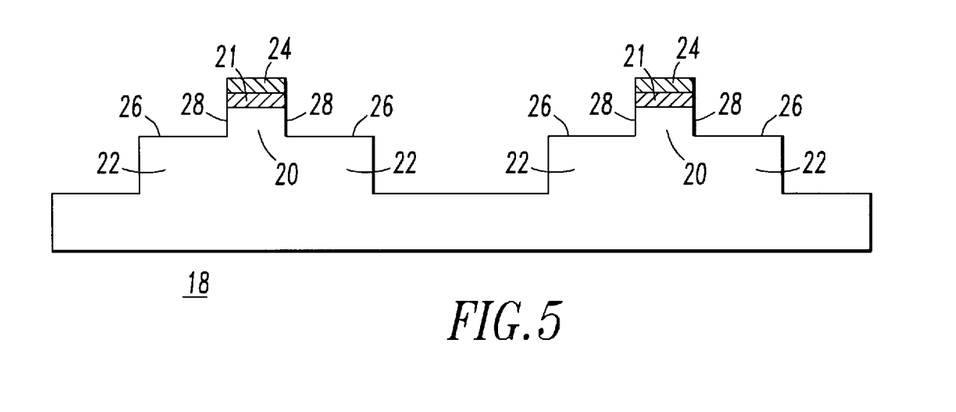
FIGS. 5 to 14 illustrate various steps in the manufacture of a silicon carbide static induction transistor in accordance one embodiment of the present invention.

A sequence of steps of one method of the present invention is illustrated in FIGS. 5–14. Referring to FIG. 5, a SiC SIT 18 having multiple sources 21 is shown. Each source 21 is located on the surface of a source post 20 and is covered by a source contact 24. The source posts 20 have adjacent source shoulders 26 and source post sides 28 extending from the source 21 to the source shoulders 26. The SiC SIT shown in FIG. 5 can be formed by any known method such as the method described above.

The method of aligning gates of a SiC SIT of the present invention includes forming spacers adjacent each source post (as shown in FIGS. 5–10) and forming gates adjacent the spacers (as shown in FIGS. 11–14) such that the spacer defines the alignment of the gates relative to each source post and thus relative to each source. The spacers may be formed by any known means and may be comprised of any known material suitable to serve as a spacer on a SiC SIT. In the preferred embodiment the spacer is comprised of a conformal CVD oxide, such as silox or TEOS.

Figure 6:
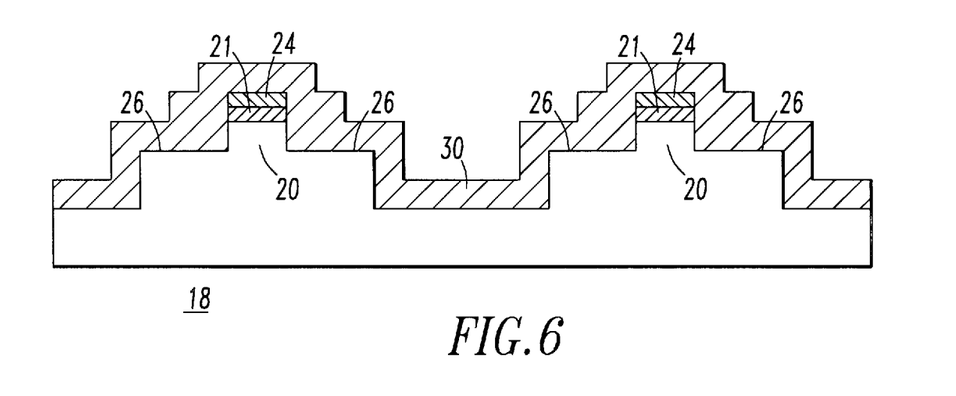

According to the preferred embodiment, the first step in forming the spacers includes depositing a layer of oxide 30 over the SiC SIT 18 as illustrated in FIG. 6. Preferably, the oxide 30 may be a conformal CVD oxide having a selected thickness between about 2000–5000 Å. The thickness of the oxide layer 30 will ultimately determine the thickness of the spacers adjacent the source posts 20 and thus the alignment of the gates relative to the source posts 20 and the sources 21. Therefore, the accuracy of the thickness of the oxide layer 30 will determine the accuracy of the alignment of the gates with the source posts 20 and thus the sources 21. By selectively tailoring the thickness of the oxide layer 30, the alignment of the gates relative to the source posts 20 and the sources 21 can also be selectively tailored. For example, if the parameters of the SiC SIT require that the gate be 3000 Å from the source post, an oxide layer 30 that is 3000 Å thick will be deposited.

In the present invention, the oxide layer 30 may be deposited accurately and uniformly to within about 0.02 micrometers of a desired thickness thereby ensuring that the spacers are within about 0.02 micrometers of a desired length and thereby ensuring that the gates are aligned to within about 0.02 micrometers of the source posts 20 and thus the sources 21. The oxide layer 30 covers the source contacts 24, the source post sides 28 and the source shoulders 26.

Figure 7:
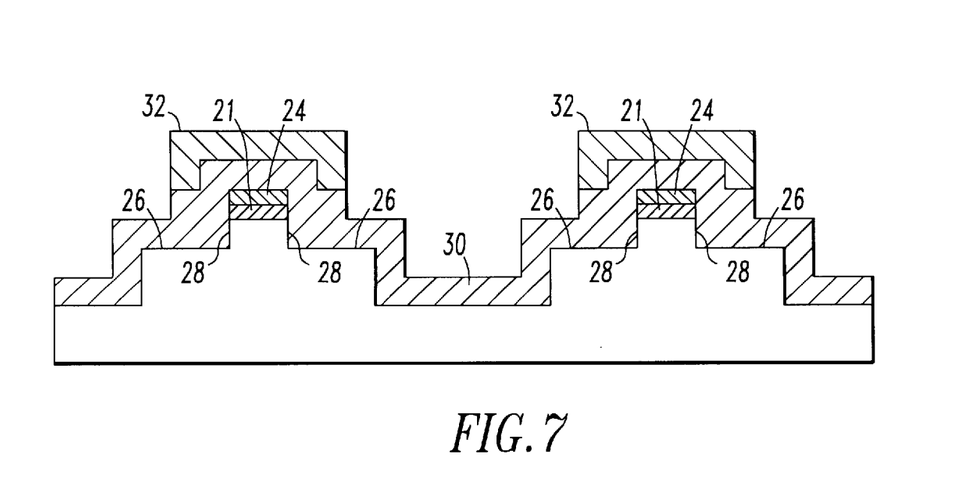
Figure 8:
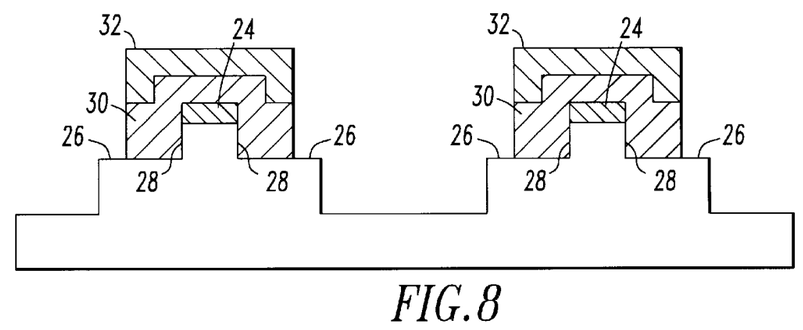
Figure 9:
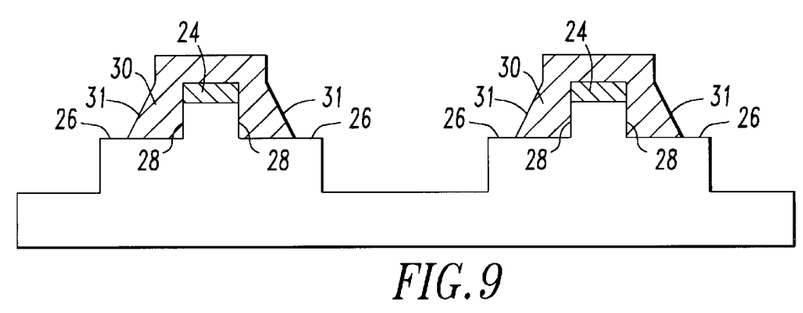

After the oxide deposition, the oxide spacers are formed by patterning the oxide layer 30 as shown in FIGS. 7–9. First, a photoresist 32 is patterned on the oxide layer 30 so that the photoresist 32 covers a portion of the oxide layer 30 covering the source contacts 24 and portions of the source shoulders 26, as shown in FIG. 7. The photoresist 32 must cover at least a portion of the oxide layer covering each source shoulder 26 and must be aligned with the shoulder 26 to within +/−½ (S), where S is the length of a shoulder 26.

Next, the exposed oxide is etched, as shown in FIG. 8, leaving behind an oxide layer 30 covering the source contact 24, the source post sides 28 and a portion of the source shoulders 26 and a photoresist 32 covering the oxide layer 30. Preferably, the exposed oxide is etched using a plasma oxide etch. The plasma oxide etch will remove all of the oxide 30 not covered by the photoresist 32. It may also remove portions of the oxide 30 underlying the edges of the photoresist 32 thereby leaving behind oxide having angled edges 31, as shown in FIG. 9, instead of vertical edges as shown in FIG. 8.

Next, the photoresist 32 is removed, as shown in FIG. 9, leaving behind the portion of the oxide layer 30 covering the source contact 24, the source post sides 28 and the source shoulders 26.

Figure 10:
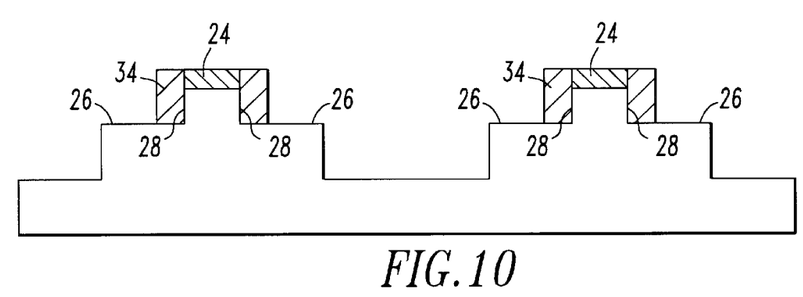

Finally, the portion of the oxide layer 30 covering the source contact 24 and the angled edges 31 are etched leaving behind oxide spacers 34. The oxide spacers 34 are adjacent the source posts 20 and cover the source post sides 28 and portions of the source shoulders 26, as shown in FIG. 10. In the preferred embodiment, the portion of the oxide covering the source contact 24 is etched using an anisotropic reactive ion etch. The reactive ion etch removes the oxide covering the source contact 24 and all the oxide extending above a horizontal plane of the source contact 24. It also removes the angled edges 31 so that the resulting spacers are generally uniform in length. The reactive ion etch also removes part of the shoulder 26, however, by tailoring the etch rate of siC and oxide, the shoulder could be only slightly etched.

While a specific method for patterning the oxide layer 30 into oxide spacers 34 has been described, it will be understood that the present invention covers any method of patterning the oxide layer 30 to form oxide spacers 34. For example, the oxide layer 30 can be patterned using a resist, photoresist or e-beam resist patterning method.

Figure 11:
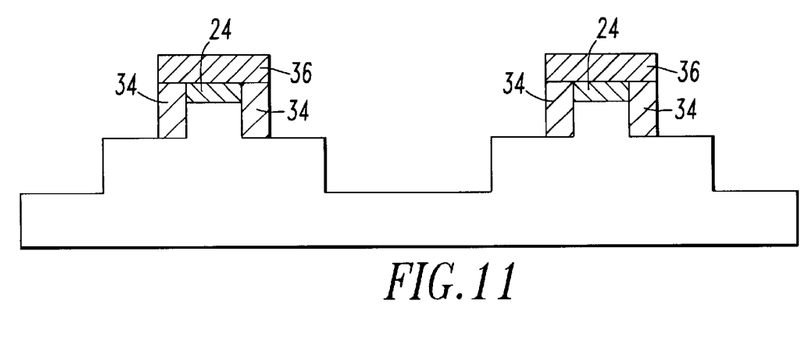

After the spacers 34 have been formed, the gates are formed by patterning a layer of photoresist 36 that covers the source contact 24 and portions of the oxide spacers 34 as shown in FIG. 11. As long as the source contact 24 is covered, the photoresist 36 can be patterned to cover some or all of the spacers 34.

Figure 12:
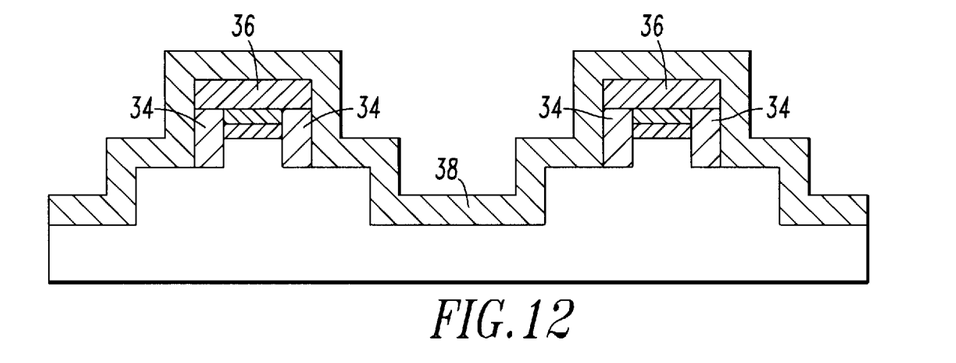

Thereafter, a metal layer 38 is deposited over the SiC SIT 18 including the photoresist layer 36 and the oxide spacers 34, as shown in FIG. 12. In the preferred embodiment, Platinum is sputtered on the transistor 18 to a thickness of about 500 Å, followed by e-beam evaporating gold to a thickness of about 2000 Å.

Figure 13:
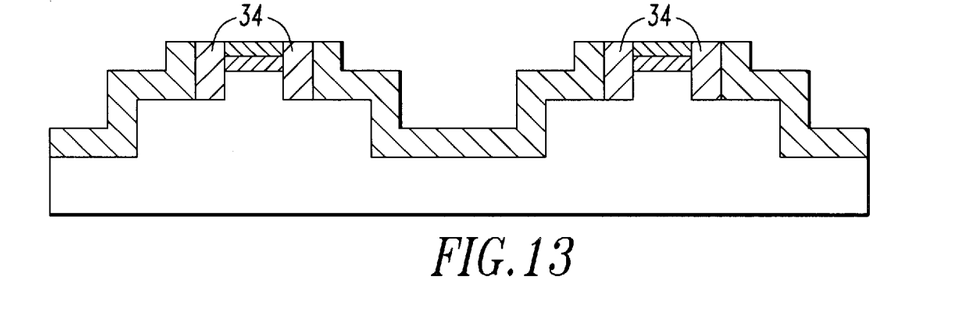
Figure 14:
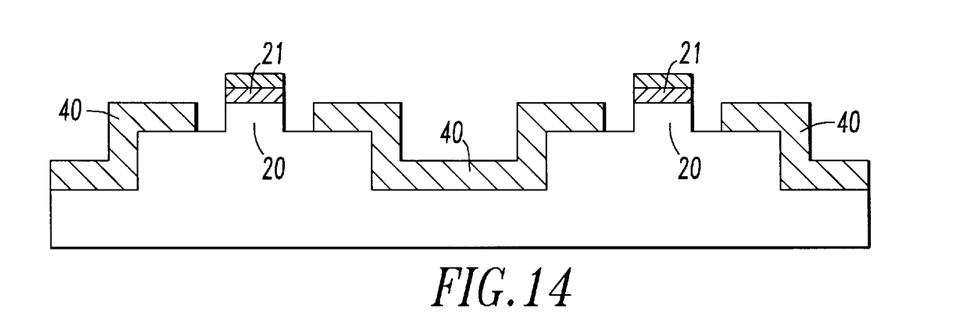

Thereafter, the photoresist layer 36 and the oxide spacers 34 are removed as shown in FIGS. 13 and 14, respectively, leaving behind gates 40 that are aligned with the source posts 20 and thus the sources 21. In the preferred embodiment, the photoresist 36 is removed by a resist lift-off process and the spacers 34 are removed by a buffered oxide etch. The gates 40 are aligned to within about 0.02 micrometers of the desired alignment. Furthermore, the alignment of the gates is independent of any inaccuracies in forming the source posts 20 or the source shoulders 26. (Proportionality of all features on the drawings are not to their scales. Actual sizes will depend on designs.)

Figure 15:
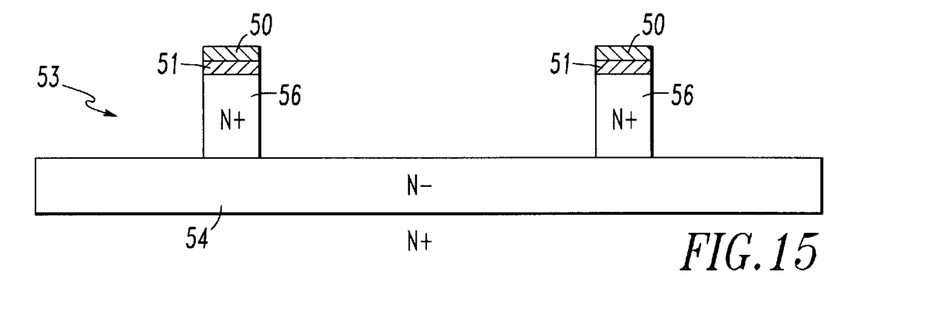
FIGS. 15 to 20 illustrate various steps in the manufacture of a silicon carbide static induction transistor in accordance another embodiment of the present invention.

Another embodiment of the method of the present invention is shown in FIGS. 15–20. Referring to FIG. 15, a Structure 53 is provided having a source 51 on the surface of a source post 56 extending from a semiconductor substrate 54. While the source post 56 and the semiconductor substrate may be comprised of any known semiconducting material suitable for a source of a SIT transistor, the source post 56 and the semiconductor substrate 54 are preferably comprised of heavily negatively doped silicon carbide (N+ doped silicon carbide) and lightly negatively doped silicon carbide (N-doped silicon carbide), respectively. The source 51 may be covered with a source contact 50 which is preferably comprised of nickel. The source post 56 and thus the source 51 may be formed by any known method.

Figure 16:
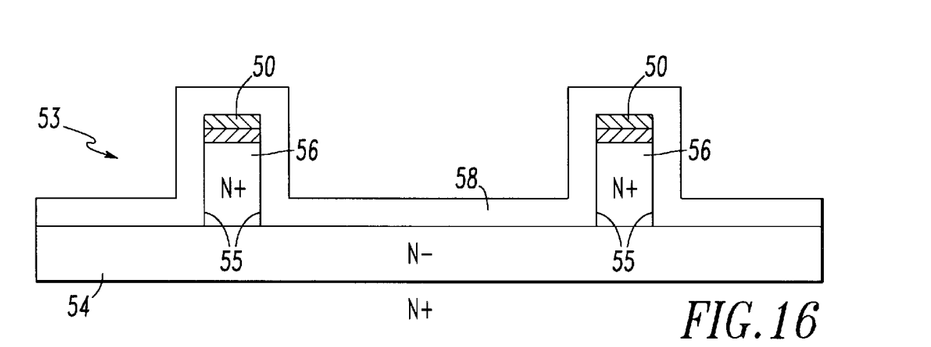

As shown in FIG. 16, a conformal layer of low temperature oxide 58 is deposited over the Structure 53 to cover the source contacts 50, the source post sides 55 and the semiconducting material 54. The oxide layer 58 is preferably comprised of silox and may be deposited by any known method. The thickness of the oxide layer 58 will determine the thickness of the spacer (not yet shown) separating the source posts 56 from the gates and thus the alignment of the gate with the source posts 56.

Figure 17:
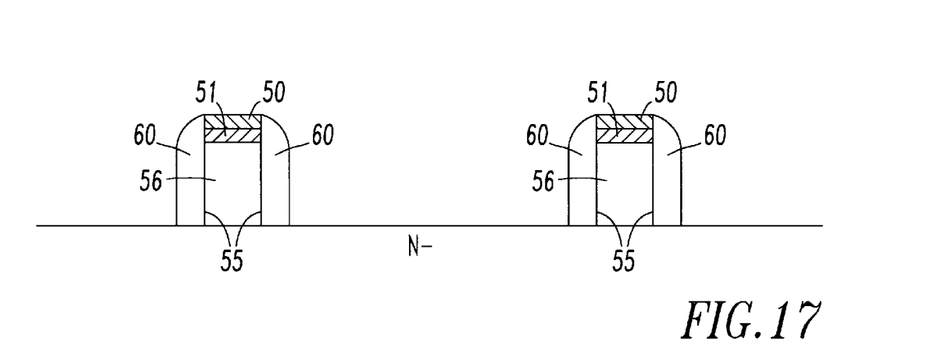

Thereafter, as shown in FIG. 17, the oxide layer 58 is etched to form spacers 60 adjacent the source posts 56. The etching step etches in a direction normal to the plane of the horizontal plane of the source 51 to a depth about equal to the thickness of the oxide layer. In this way, all of the oxide overlying the source contact 50 and the portion of the oxide layer not covering the source post sides 55 is removed thereby leaving behind the oxide covering the source post sides 55 to a height about parallel to the exposed surface of the source contact 50. In the preferred embodiment, the oxide layer 58 is etched with an anisotropic reactive ion etch.

Figure 18:
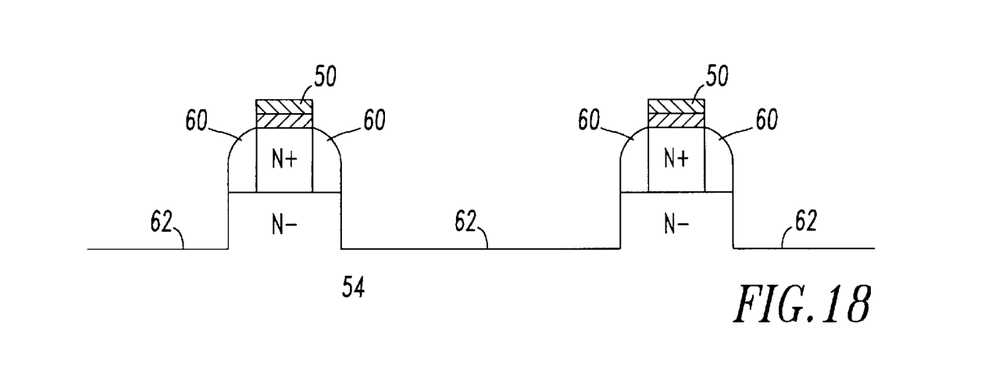

Thereafter, as shown in FIG. 18, the spacers 60 are again etched to remove the portions of the spacers 60 contacting the source contact 50. This etch step, however, will have an etching effect on the exposed source contact 50 and on the exposed semiconductor substrate 54 such that trenches 62 will be formed in the semiconductor substrate 54. Therefore, the etching rate of the etchant on the spacers 60, the source contact 50 and the semiconductor substrate 54 is important. The spacers 60 may be etched so that the resulting trenches 62 are etched to a depth between about 0.25 and 0.8 microns. In the preferred embodiment, a chloride based reactive ion etch is used. For example, the etch rates for various materials using a BC13/C12 reactive ion etch plasma is as follows:

| | |
|---|---|
| silicon carbide | 300 Å/min |
| nickel | 20 Å/min |
| silox | 150 Å/min |
| Molybdenum | 1100 Å/min |

Thus, for example, for a 0.4 micron etch of a silicon carbide semiconductor substrate 54, a nickel source contact 50 will be etched 260 Å and a silox spacer 60 will be etched 2000 Å.

Thereafter, an ohmic metal is deposited on the back side of the SIT transistor and the SIT transistor is then sintered at about 1150° C. to form the source drain contacts (not shown). The sintering process will also densify the oxide spacers 60.

Figure 19:
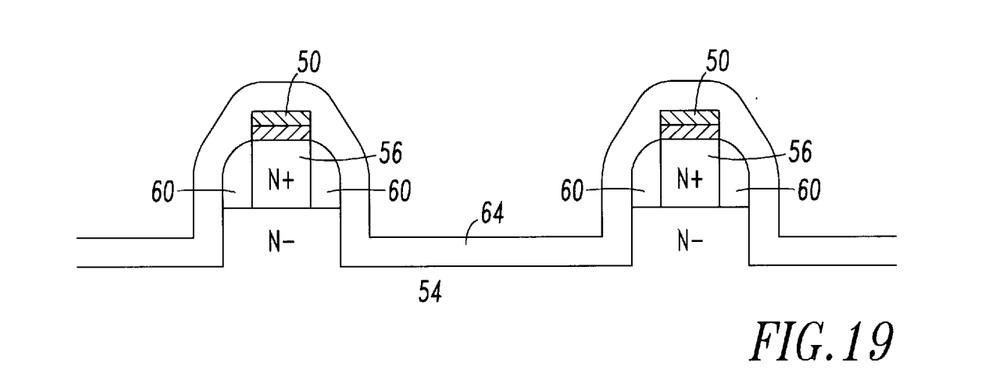

Thereafter, as shown in FIG. 19, a gate metal layer 64 is deposited over the SIT transistor to cover the source contacts 50, the source posts 56, the spacers 60 and the semiconductor substrate 54. The thickness and the composition of the gate metal 64 determines the gate resistance. The gate metal layer 64 may be comprised of molybdenum, nickel or platinum. In the preferred embodiment a schottky barrier metal is deposited, followed by a layer of gold to decrease gate resistance. The gate metal layer 64 may be deposited by any known method, such as sputtering.

Figure 20:
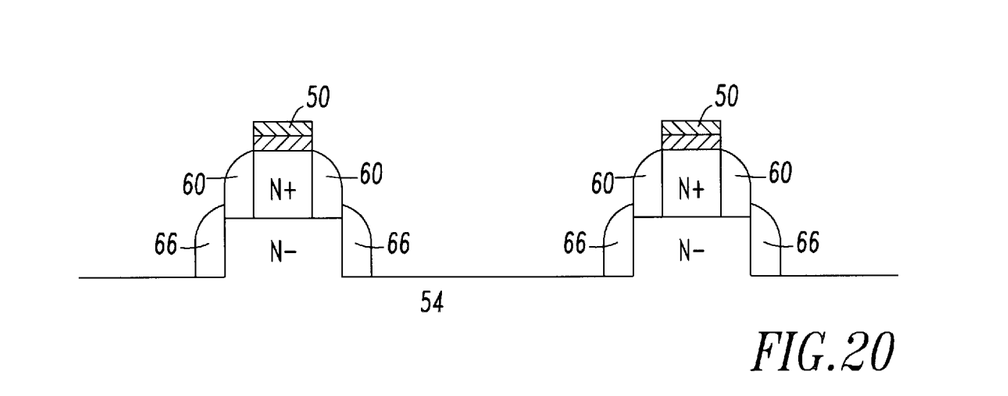

Thereafter, as shown in FIG. 20, the gate metal layer 64 is etched to form gate contacts 66. If molybdenum is used then the gate metal layer 64 is etched with a reactive ion etch. If the gate is to be etched to about the level shown in FIG. 20, then the source contact 50, the spacers 60 and the semiconductor substrate 54 will also be etched. The etch rates of the different materials must be accounted for. For example, Molybdenum has an etch rate 7 times faster than silicon carbide and 3.7 times faster than silicon oxide. When the molybdenum gates 66 are etched the source contacts 50, the spacers 60 and the semiconductor substrate 54 will also be etched.

If the gate layer 64 is comprised of gold overlying a schottky barrier metal then the gold is etched first by ion milling followed by a reactive ion etch of the schotky barrier. Again the different etch rates of the materials will have to be accounted for.

While the method of the present invention has been described in terms of SiC SITs, it will be understood that the method can be used to produce other transistors or to otherwise align transistor components.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of aligning a source and a gate of a silicon carbide static induction transistor, comprising the steps of:

(a) providing a silicon carbide static induction transistor having a gate, a source post with sides, a source on the surface of the source post, a source contact overlying the source, and source shoulders adjacent the sides of the source post said sides extending from said source to said source shoulders;

(b) depositing a CVD oxide layer over the transistor such that said oxide covers the source contact, the source shoulders, and the source post sides;

(c) depositing photoresist on the portion of the oxide covering the source contact, the source shoulders, and the source post sides;

(d) etching the exposed oxide;

(e) removing the photoresist to expose the oxide covering the source contact, the source shoulders, and the source post sides;

(f) etching the oxide to remove the oxide covering the source contact while leaving the oxide covering the source shoulders and the source sides thereby creating oxide spacers having a height extending to about the source contact;

(g) depositing photoresist over the source contact and selected portions of the oxide spacers such that the source contact is completely covered;

(h) depositing a metal layer over the transistor such that the exposed portions of the source shoulder are covered;

(i) removing the photoresist to expose the source contact; and (j) removing the oxide spacers whereby the portions of the source shoulders covered with the metal layer form gates which are selectively aligned with the source post and thus the source.

2. The method of claim 1 wherein the oxide is deposited at a thickness between about 2800 and 4200 angstroms.

3. The method of claim 2 wherein the thickness of the deposited oxide is tailored according to the desired distance between the source post and the gate contacts.

4. The method of claim 1 wherein the step of depositing photoresist on the portion of the oxide covering the source contact, the source shoulders and the source post sides includes depositing the photoresist at an accuracy within ½ the length of the shoulder.

5. The method of claim 1 wherein the step of patterning photoresist is performed with e-beam resist patterning.

6. The method of claim 1 wherein the step of etching the oxide is done with an anisotropic reactive ion etching.

7. The method of claim 1 wherein the step of etching the exposed oxide comprises a plasma oxide etch.

8. The method of claim 1 wherein the step of depositing a metal layer comprises the steps of:

(a) sputtering Pt at about 500 Å; and (b) e-beam evaporating gold at about 2000 Å.

9. A method of aligning a source and a gate of a transistor, comprising the steps of:

a) providing a transistor having a gate, a source post with sides, source shoulders adjacent the source post, and a source contact overlying the source post;

(b) depositing a CVD oxide layer of a selected thickness over the transistor such that oxide covers the source contact, the source post sides and the source shoulders;

(c) patterning the oxide to remove oxide covering the source contact while leaving the oxide covering at least a portion of the source shoulders and the source post sides thereby creating oxide spacers adjacent the source post; and (d) forming gates on the transistor where the oxide spacers define the alignment of the gates with the source post.

10. The method of claim 9 wherein the step of patterning the oxide comprises the steps of:

(a) patterning the oxide a first time such that the oxide only covers the source contact, the source shoulders and the source post sides; and (b) etching the oxide to remove the oxide covering the source contact while leaving the oxide covering the source shoulders and the source post sides.

11. The method of claim 9 wherein the thickness of the CVD oxide layer between 2800 and 4200 Angstroms.

12. The method of claim 9 wherein the CVD oxide layer is deposited to within 0.02 micrometers of the selected thickness.

13. The method of claim 9 wherein the oxide spacers have a length within about 0.02 micrometers of an optimal length.

14. The method of claim 9 wherein the thickness of the oxide layer about equals the length of the oxide spacers.

15. The method of claim 9 wherein the thickness of the oxide layer about equals the distance between the gate and the source post.

16. The method of claim 9 wherein the length of the oxide spacers about equals the distance between the gate and the source post.

17. The method of claim 10 wherein the step of etching the oxide comprises an anisotropic reactive ion etching.

18. The method of claim 9 wherein the step of forming a gate comprises the steps of:
   (a) depositing a photoresist over the source contact and portions of the source shoulders;
   (b) depositing a metal layer over the transistor; and
   (c) removing the photoresist and the oxide spacers thereby forming a gate selectively aligned with the source post.

19. The method of claim 9 wherein the thickness of the deposited oxide layer about equals the length of the oxide spacers.

20. The method of claim 9 wherein the transistor is a silicon carbide transistor.

21. A method of forming a gate in a transistor wherein the gate is optimally aligned with a source, comprising the steps of:
   (a) providing a transistor having a source post;
   (b) forming spacers adjacent the source post;
   (c) depositing a metal layer on the transistor; and
   (d) removing the spacers to thereby form gates aligned with the source post, where the distance between the source post and the gate is defined by the spacers.

22. The method of claim 21 wherein the step of removing the spacers comprises a buffered oxide etch.

23. The method of claim 21 wherein the transistor is a silicon carbide transistor.

24. The method of claim 21 wherein the gate is within 0.02 micrometers of the optimal alignment.

25. A method of aligning a gate and a source post of a static induction transistor, comprising the steps of:
   a) providing at least one source post extending from a silicon carbide substrate;
   b) depositing a spacer layer over the source post and the silicon carbide substrate;
   c) etching the spacer layer to thereby form spacers adjacent the source post;
   d) etching the silicon carbide substrate to form a trench adjacent the source post and spacer;
   e) after the etching of the spacer layer and the silicon carbide substrate, depositing a layer of gate metal whereby the gate metal covers the silicon carbide substrate in the trench, the source post and the spacers; and
   f) etching the gate metal layer to thereby form gates where the spacers define the distance between the gates and the source post.

26. The method of claim 25 wherein the transistor is a silicon carbide transistor.

27. The method of claim 25 wherein the spacer layer is comprised of a low temperature oxide.

28. The method of claim 25 wherein the step of etching the spacer layer is comprised of the steps of:
   a) etching the spacer layer using an anisotropic reactive ion etch to thereby form spacers; and
   b) etching the spacers using a chloride based reactive ion etch.

29. The method of claim 25 wherein the step of etching the silicon carbide substrate is a C12 based reactive ion etch.

30. The method of claim 29 wherein the step of etching the spacers is a Bc13 based reactive ion etch.

31. The method of claim 25 wherein the gate metal layer is comprised of Molybdenum, nickel or platinum.

32. The method of claim 31 wherein the gate metal is etched using an anisotropic reactive ion etch.

33. The method of claim 25 wherein the gate metal layer is comprised of gold overlying a schotkey metal barrier.

34. The method of claim 33 wherein the step of etching the metal layer comprises the steps of:
   a) ion milling the gold; and
   b) reactive ion etching the schottkey metal barrier.

35. The method of claim 25 wherein the source post is comprised of silicon carbide.

36. The method of claim 25 wherein the source post comprises silicon carbide covered with nickel.

* * * * *